(12) United States Patent
Kruijt-Stegeman et al.

(10) Patent No.: US 8,043,085 B2
(45) Date of Patent: Oct. 25, 2011

(54) IMPRINT LITHOGRAPHY

(75) Inventors: Yvonne Wendela Kruijt-Stegeman, Eindhoven (NL); Andre Bernardus Jeunink, Bergeijk (NL); Johannes Petrus Martinus Bernardus Vermeulen, Helmond (NL); Sander Frederik Wuister, Eindhoven (NL); Raymond Wilhelmus Louis Lafarre, Helmond (NL); Catharinus De Schiffart, Nijmegen (NL); Norbert Erwin Therenzo Jansen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 7 days.

(21) Appl. No.: 12/468,743

(22) Filed: May 19, 2009

(65) Prior Publication Data

US 2010/0044917 A1 Feb. 25, 2010

Related U.S. Application Data

(60) Provisional application No. 61/136,217, filed on Aug. 19, 2008.

(51) Int. Cl.
*B29C 59/00* (2006.01)
(52) U.S. Cl. ........................................ 425/385; 425/150
(58) Field of Classification Search .................. 425/385, 425/149, 150; 264/293
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,180,239 B1 | 1/2001 | Whitesides et al. | |
| 6,334,960 B1 | 1/2002 | Willson et al. | |
| 2003/0081193 A1 | 5/2003 | White et al. | |
| 2004/0124566 A1 | 7/2004 | Sreenivasan et al. | |
| 2005/0006343 A1 | 1/2005 | Choi et al. | |
| 2005/0274693 A1 | 12/2005 | Heidari et al. | |
| 2006/0279022 A1 | 12/2006 | Seki et al. | |
| 2008/0145774 A1 | 6/2008 | Kruijt-Stegeman et al. | |

FOREIGN PATENT DOCUMENTS

| | | |
|---|---|---|
| WO | 02/067055 A2 | 8/2002 |
| WO | 2007/132320 A2 | 11/2007 |

OTHER PUBLICATIONS

Haisma et al., "Mold-assisted nanolithography: A process for reliable pattern replication", J. Vac. Sci. Technol. B14 (6), pp. 4124-4128, Nov. 1996.

*Primary Examiner* — Maria Veronica Ewald
(74) *Attorney, Agent, or Firm* — Pillsbury Winthrop Shaw Pittman LLP

(57) ABSTRACT

An imprint lithography apparatus is disclosed that has a first support structure arranged to support an imprint template, and a first actuator attached to the first support structure, and arranged in use to be located between the first support structure and the imprint template. The first actuator is configured to apply a force to the imprint template. The imprint lithography apparatus further includes a second support structure and a second actuator located between the second support structure and the first support structure. The second actuator is configured to apply a force to the second support structure, wherein a range of movement of the second actuator is greater than a range of movement of the first actuator.

18 Claims, 11 Drawing Sheets

IMPRINT LITHOGRAPHY

This application claims priority and benefit under 35 U.S.C. §119(e) to U.S. Provisional Patent Application No. 61/136,217, entitled "Imprint Lithography", filed on Aug. 19, 2008. The content of that application is incorporated herein in its entirety by reference.

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" to transfer a pattern onto a substrate. An advantage of imprint lithography is that the resolution of the features is not limited by, e.g., the wavelength of a radiation source or the numerical aperture of a projection system as in photolithography, but mainly just by the pattern density on the stamp (also referred to as a template). There are three main approaches to imprint lithography, examples of which are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto an imprintable medium layer 13 which is supported by a substrate 12 and planarization and transfer layer 12'. The template 10 has a pattern of features on its surface, the molecular layer being disposed upon the features. When the template is pressed against the imprintable medium layer, the layer of molecules 11 are transferred onto the imprintable medium. After removal of the template, the imprintable medium is etched such that the areas of the imprintable medium not covered by the transferred molecular layer are etched down to the substrate. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic polymer resin 15, which has been cast on the surface of a substrate 12. The resin may for instance be spin coated and baked onto the substrate surface or, as in the example illustrated, onto a planarisation and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly(methyl methacrylate), polystyrene, poly(benzyl methacrylate) or poly(cyclohexyl methacrylate). For more information on hot imprint, see e.g. U.S. Pat. No. 4,731,155 and U.S. Pat. No. 5,772,905.

FIG. 1c shows an example of ultraviolet radiation (UV) imprint lithography, which involves the use of a transparent template and a UV-curable liquid as imprintable medium (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV radiation that is applied through the quartz template onto the resin. After removal of the template, the pattern will consist of the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

SUMMARY

Although imprint lithography has many advantages associated with it, there are one or more disadvantages associated with imprint lithography. As described above, a pattern may be imprinted into an imprintable medium using an imprint template. The imprintable medium will be carried by a substrate. If during an imprint lithography process the temperature of one or more elements used in the imprint lithography process changes, a problem may arise in aligning or overlaying imprinted patterns. For instance, if the temperature of the substrate increases, the substrate will expand. This means that the shape and/or size of an imprinted pattern will depend on the temperature of the substrate. Such change in shape or size of the imprinted pattern can make it difficult or impossible to accurately align and/or overlay imprinted patterns. Such a difficulty may make it more difficult to create a large number of functioning devices on the substrate, thereby reducing the yield.

A plurality of actuators (e.g. piezoelectric actuators) located around an imprint template or imprint template holder may be used. The actuators may be actuated to apply a force to the imprint template in order to change the shape and/or size of the imprint template. For example, the piezoelectric actuators can be actuated to bend the imprint template to speed up imprinting and release processes, or to change the in-plane shape and/or size of the imprint template to compensate for a change in magnification. However, although the use of actuators in this way is advantageous, the use and potential functionality of such actuators has not yet been fully exploited.

An actuator that has been suggested as being suitable for providing a force on an imprint template to, for example, change the shape of an imprint template, is a piezoelectric actuator. A piezoelectric actuator is particularly suitable since it can exert a large force and that force and the position at which that force is applied can be accurately controlled (for example, in combination with one or more sensors or the like). An other advantage of a piezoelectric actuator is the low heat-generation during use, and the compact construction of such an actuator. However, piezoelectric actuators have a small range of motion, and this can adversely affect the use of piezoelectric actuators in controlling, for example, the shape of an imprint template used in an imprint lithography process. One or more actuators with a larger range of motion could be used in place of the piezoelectric actuator. However, it is more difficult to accurately control and maintain the force applied with actuators having such a larger range of motion.

Accordingly, it is desirable, for example, to provide an imprint lithography apparatus and method which solves one or more of the problems referred to above and/or one or more other problems, whether identified herein or not.

According to an aspect, there is provided an imprint lithography apparatus comprising: a first support structure arranged to support an imprint template arrangement; a first actuator attached to the first support structure, and arranged in use to be located between the first support structure and the imprint template arrangement, the first actuator configured to apply a force to the imprint template arrangement; a second support structure; and a second actuator located between the second support structure and the first support structure, the second actuator configured to apply a force to the first support structure, a range of movement of the second actuator being greater than a range of movement of the first actuator.

The imprint template arrangement may be an imprint template holder, an imprint template, or an imprint template holder and an imprint template.

The first actuator may be configured to apply a force to a peripheral edge or face of the imprint template arrangement.

The second actuator may be configured to apply a force to a peripheral edge or face of the first support structure.

Another first actuator may be provided on an opposite side of the first support structure to meet an opposite side of the imprint template arrangement; and/or another second actuator may be provided on an opposite side of the second support structure to meet an opposite side of the first support structure.

The first actuator may be one of a plurality of first actuators, and/or the second actuator may be one of a plurality of second actuators.

The first actuators may be individually controllable; and/or the second actuators may be individually controllable.

The plurality of first actuators may be located in positions on the first support structure which, in use, surround the imprint template arrangement, or extend along one or more sides of the imprint template arrangement; and/or the plurality of second actuators may be located in positions on the second support structure which surround the first support structure or extend along one or more sides of the first support structure.

The first actuator may be a piezoelectric actuator, a pneumatic actuator, a hydraulic actuator, an electromagnetic actuator, a voice coil or a screw thread arrangement. The second actuator may be: a pneumatic actuator, a hydraulic actuator, an electromagnetic actuator, a voice coil or a screw thread arrangement.

The first support structure may be arranged to surround the imprint template arrangement. The second support structure may be arranged to surround the first support structure.

The first support structure may be expandable, or comprise a plurality of segments.

The second actuator may be attached to the second support structure and the first support structure.

According to an aspect, there is provided an imprint lithography method of using an imprint apparatus, the imprint apparatus comprising: a support structure; an imprint template arrangement; and an actuator located between the support structure and the imprint template arrangement, the actuator configured to apply a force to the imprint template arrangement, wherein the method comprises controlling a position of the imprint template arrangement using the actuator.

Controlling a position of the imprint template arrangement may be undertaken before a pattern is imprinted into an imprintable medium using the imprint template arrangement.

Controlling a position of the imprint template arrangement may be undertaken when the imprint template arrangement is imprinted in an imprintable medium.

The method may further comprise controlling a shape or size of the imprint template arrangement using the actuator.

The actuator may be a piezoelectric actuator, a pneumatic actuator, a hydraulic actuator, an electromagnetic actuator, a voice coil or a screw thread arrangement.

According to an aspect, there is provided an imprint lithography apparatus comprising: a support structure arranged to support an imprint template arrangement; an actuator attached to the support structure, and arranged in use to be located between the support structure and the imprint template arrangement, the actuator configured to apply a force to the imprint template; and a controller configured to control actuation of the actuator in order to control a position of the imprint template.

The actuator may be a piezoelectric actuator, a pneumatic actuator, a hydraulic actuator, an electromagnetic actuator, a voice coil or a screw thread arrangement.

According to an aspect, there is provided an imprint lithography method of using an imprint apparatus, the imprint apparatus comprising: a support structure; an imprint template arrangement; and an actuator located between the support structure and the imprint template arrangement, the actuator configured to apply a force to the imprint template arrangement, wherein the method comprises using the actuator to change a shape and/or size of the imprint template arrangement in order to take into account a change in a temperature of at least a part of the imprint template arrangement and/or a change in a temperature of at least a part of a substrate onto which a pattern is to be imprinted using the imprint template arrangement.

The method may further comprise determining a change of the size and/or shape of the at least a part of the substrate and/or of the at least part of the imprint template arrangement due to the change in temperature of the at least a part of the imprint template arrangement and/or of the at least a part of the substrate.

Determining the change of the size and/or shape of the at least a part of the imprint template arrangement and/or of the substrate comprises determining a change in position of one or more alignment marks provided on the imprint template arrangement and/or the substrate, or comprises determining the temperature of the at least a part of the imprint template arrangement and/or of the at least a part of the substrate.

The method may further comprise determining a desired change in shape and/or size of the imprint template arrangement to take into account the change of size and/or shape of the at least a part of the substrate and/or of the at least part of the imprint template arrangement and using the actuator to change a shape and/or size of the imprint template arrangement to the desired shape and/or size.

The actuator may be a piezoelectric actuator, a pneumatic actuator, a hydraulic actuator, an electromagnetic actuator, a voice coil or a screw thread arrangement.

According to an aspect, there is provided an imprint lithography apparatus comprising: a support structure arranged to support an imprint template arrangement; an actuator attached to the support structure, and arranged in use to be located between the support structure and the imprint template arrangement, the actuator configured to apply a force to the imprint template arrangement; and a controller configured to control actuation of the actuator in order to control a shape and/or size of the imprint template arrangement to take into account a change in a temperature of at least a part of the template arrangement and/or a change in a temperature of at least a part of a substrate onto which, in use, the imprint template arrangement is arranged to imprint a pattern.

The actuator may be a piezoelectric actuator, a pneumatic actuator, a hydraulic actuator, an electromagnetic actuator, a voice coil or a screw thread arrangement.

According to an aspect, there is provided an imprint lithography apparatus comprising: a support structure arranged to support an imprint template arrangement; and a first actuator and a second actuator arranged in series with respect to one another to form a first and second actuator series arrangement, the first and second actuator series arrangement being attached to the support structure, and arranged in use to be located between the support structure and the imprint template arrangement, the first and second actuator series arrangement configured to apply a force to the imprint template arrangement, and a range of movement of the second actuator is greater than a range of movement of the first actuator.

The first and second actuator series arrangement may be arranged to apply a force to a peripheral edge or face of the imprint template arrangement.

The first actuator and second actuator of the first and second actuator series arrangement may be individually controllable.

The first actuator of the first and second actuator series arrangement may be adjacent to the imprint template arrangement, and the second actuator of the first and second actuator series arrangement may be adjacent to the support structure. Alternatively, the second actuator of the first and second actuator series arrangement may be adjacent to the imprint template arrangement, and the first actuator of the first and second actuator series arrangement may be adjacent to the support structure. In an embodiment, these alternatives may be combined, so that for some series arrangements the first actuator is adjacent to the support structure, and the second actuator is adjacent to the imprint template arrangement, and for other series arrangements the second actuator is adjacent to the support structure, and the first actuator is adjacent to the imprint template arrangement.

Another first and second actuator series arrangement may be provided on an opposite side of the support structure to meet an opposite side of the imprint template arrangement.

The first and second actuator series arrangement may be one of a plurality of first and second actuator series arrangements.

The plurality of first and second actuator series arrangements may be located in positions on the support structure which, in use, surround the imprint template arrangement, or extend along one or more sides of the imprint template arrangement.

The first actuator may be: a piezoelectric actuator, a pneumatic actuator, a hydraulic actuator, an electromagnetic actuator, a voice coil or a screw thread arrangement, and/or the second actuator may be: a pneumatic actuator, a hydraulic actuator, an electromagnetic actuator, a voice coil or a screw thread arrangement.

The support structure may be arranged to surround the imprint template arrangement.

According to an aspect, there is provided an imprint lithography apparatus comprising: a support structure arranged to support an imprint template arrangement; and a first actuator attached to the support structure, and arranged in use to support a second actuator, the second actuator configured to apply a force to the imprint template arrangement, the first actuator being actuable to move the second actuator.

The second actuator may be attached to, or form part of, a body that is supported by the first actuator.

A plurality of first actuators may be provided, the plurality of first actuators extending from one or more sides or parts (or different sides or parts) of the support structure to support the second actuator.

The support structure may fully or partially surround the imprint template arrangement.

A plurality of first actuators may be attached to the support structure, such that the plurality of second actuators extend along one or more sides of the imprint template arrangement.

The first actuator may be a piezoelectric actuator, a pneumatic actuator, a hydraulic actuator, an electromagnetic actuator, a voice coil or a screw thread arrangement, and/or the second actuator may be: a pneumatic actuator, a hydraulic actuator, an electromagnetic actuator, a voice coil or a screw thread arrangement.

DETAILED DESCRIPTION

Figure 1A:
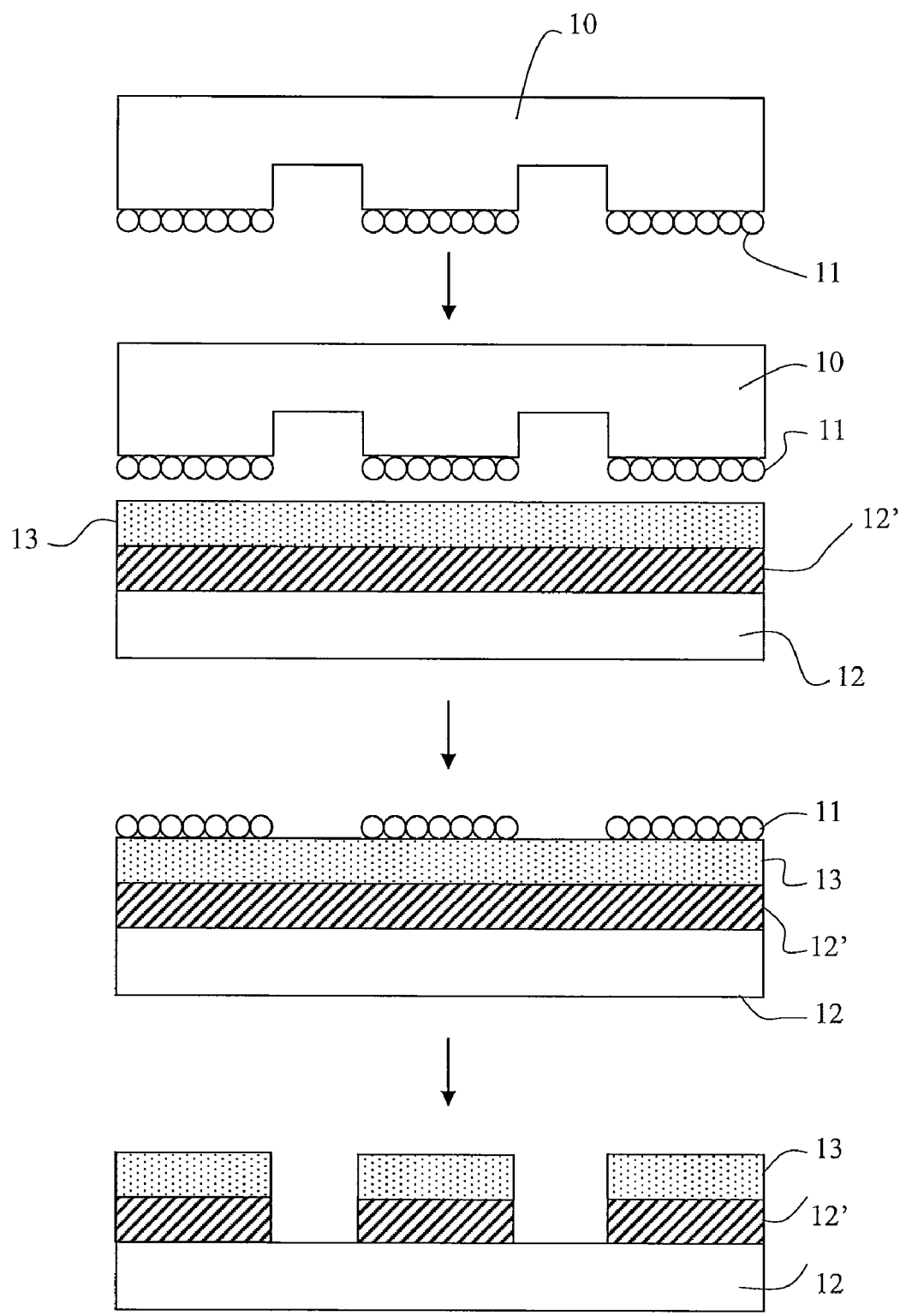
FIGS. 1a to 1c schematically depict examples of, respectively, micro-contact printing, hot imprinting, and UV imprinting.
Figure 1B:
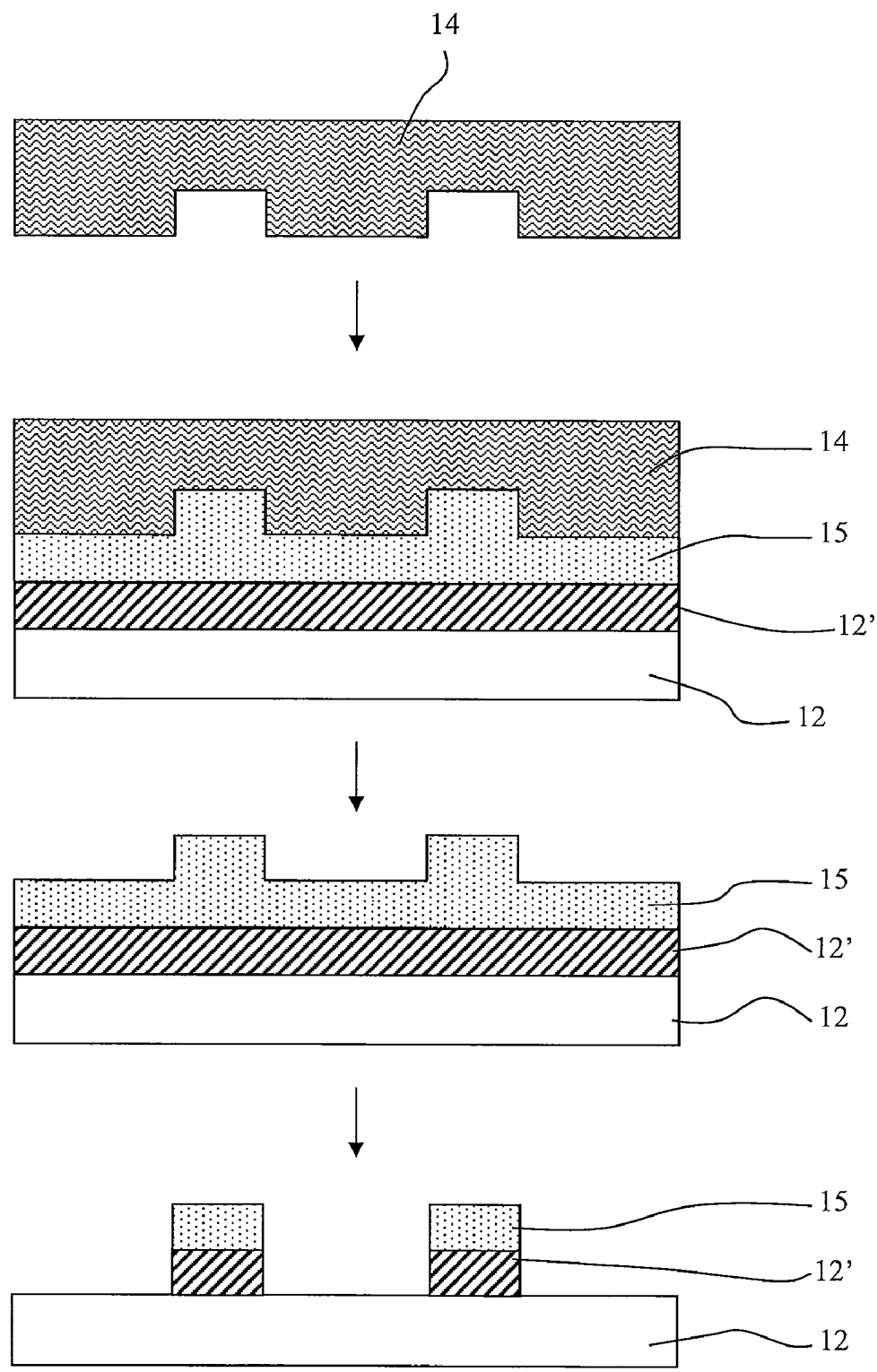
Figure 1C:
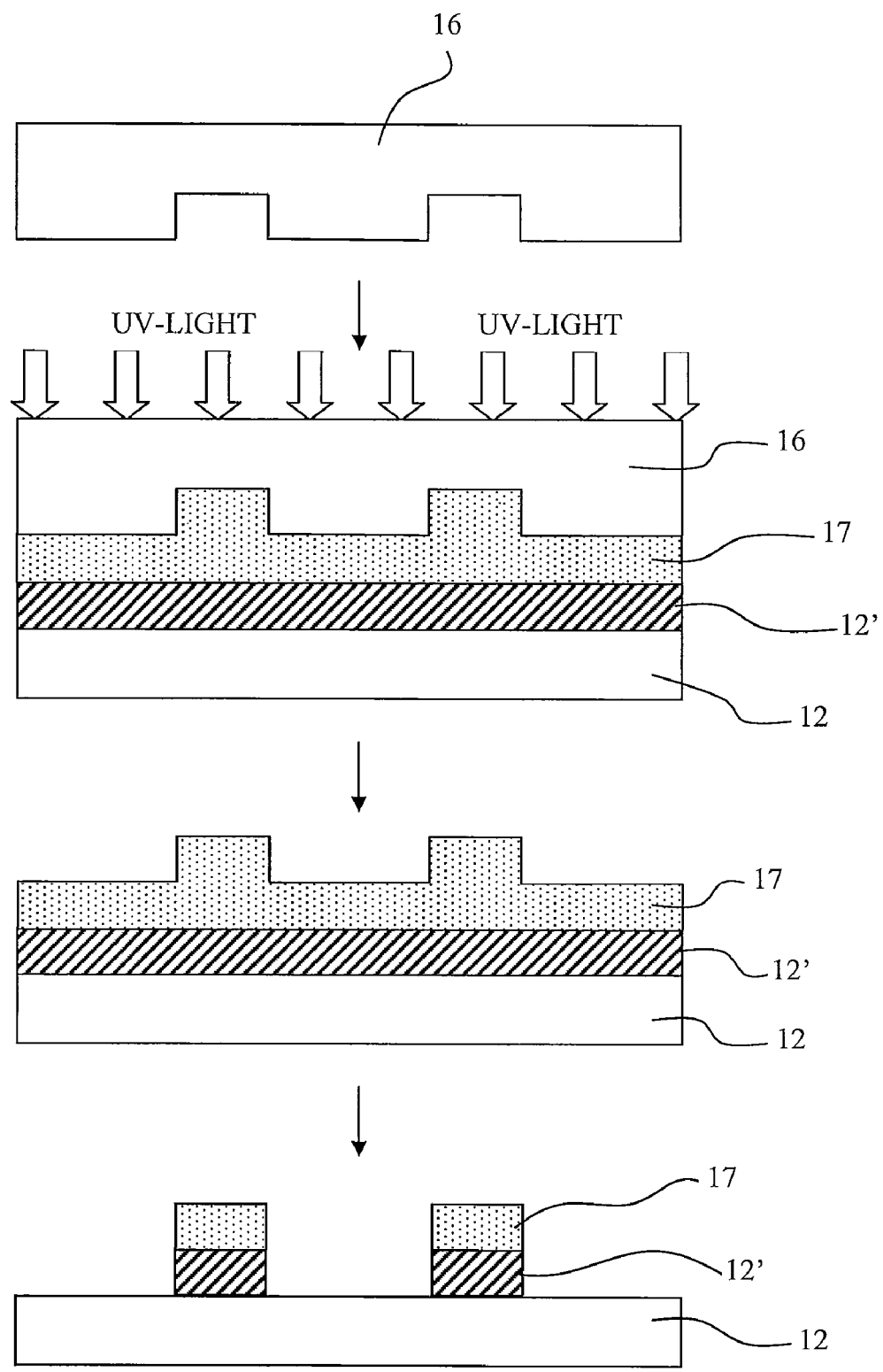
Figure 2A:
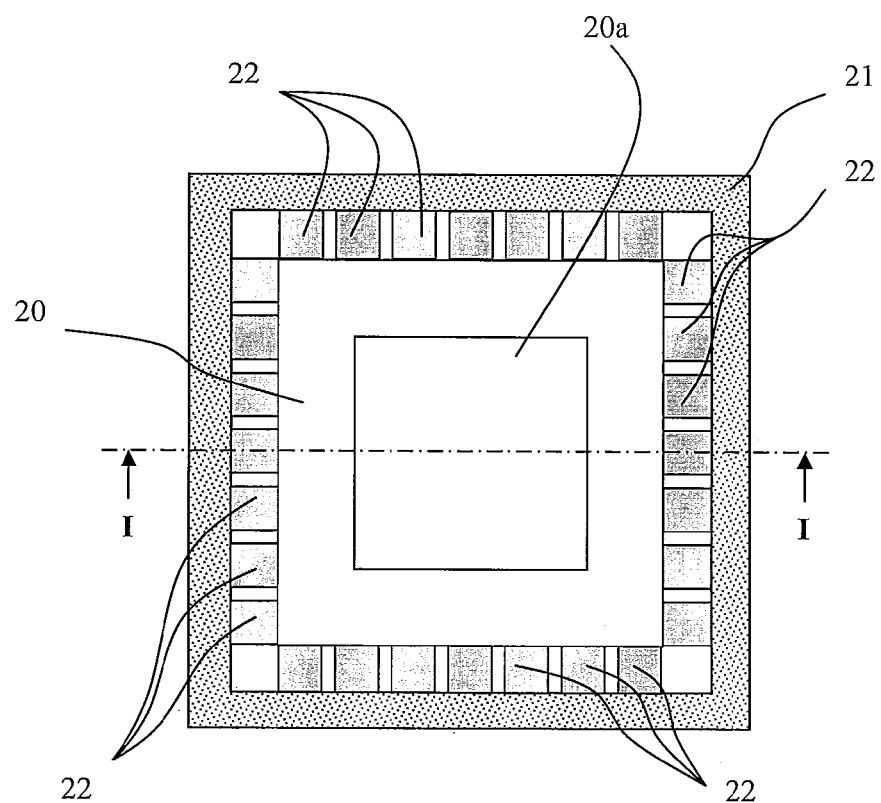
FIGS. 2a and 2b schematically depict an underside view and a part-section view of a imprint template configuration of an imprint apparatus, respectively.
Figure 2B:
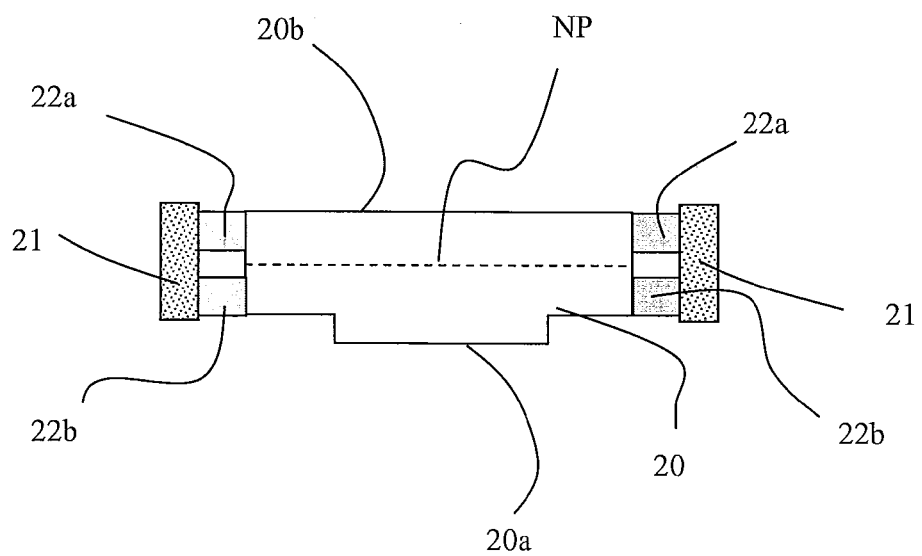

FIGS. 2a and 2b illustrate an imprint template configuration of an imprint apparatus. FIG. 2a shows an underside view of the imprint template configuration of the imprint apparatus, and FIG. 2b illustrates a part section view of the imprint template configuration of the imprint apparatus of FIG. 2a taken along the line I-I. In an embodiment, there is an imprint apparatus that includes the imprint template configuration of FIG. 2, with or without the imprint template. The imprint apparatus may further comprise a substrate table configured to hold a substrate into which the pattern side of the imprint template is imprinted. The imprint apparatus may include actuators to move the substrate table and/or to move the imprint template configuration. The imprint apparatus may include one or more measurement devices to measure a position of the substrate, the imprint template, the substrate table, and/or the imprint template configuration. Such measurement devices may include an interferometer and/or optical alignment sensor used in conjunction with one or more alignment marks on the substrate, the imprint template, the substrate table, and/or the imprint template configuration.

The configuration is configured to include or hold an imprint template 20, which is substantially planar in shape. The imprint template 20 has two substantially square surfaces, one of which is provided with a patterned region 20a (the height of which is exaggerated in the Figure for clarity), and the other of which is known as the 'backside' 20b (i.e. the non-patterning region of the imprint template 20). The patterned region 20a and backside 20b can be shapes other than square, for example rectangular. The imprint template 20 also has four peripheral sides which extend around the imprint template 20. Extending around the periphery of the imprint template 20 is a support structure 21. The support structure 21 holds the imprint template 20 in position using actuators 22 which press against the peripheral faces of the imprint template 20. As shown in FIG. 2, the actuators 22 are piezoelectric element. In an embodiment, the piezoelectric elements 22 may be accommodated in recesses or guide (etc.) in the imprint template 20. The piezoelectric elements 22 are individually controllable, so that the force they exert on the imprint template 20 can be individually controlled.

FIG. 2a shows that each side of the imprint template 20 is supported by seven piezoelectric elements 22. However, it can be seen from FIG. 2b that there are two layers of piezoelectric elements attaching the imprint template 20 to the support structure 21. A first layer of piezoelectric elements 22a are located above the neutral plane NP of the imprint template 20. A second layer of piezoelectric elements 22b are located below the neutral plane NP of the imprint template 20. The first and second layers of piezoelectric elements 22a, 22b extend substantially parallel to one another, and along each respective side of the support structure 21.

When loaded in pure bending, the neutral plane NP of the imprint template 20 is a plane where compression and tension stresses are zero. The neutral plane NP extends through and across the imprint template and substantially bisects each of the imprint template's 20 peripheral faces. If a force directed towards the center of the imprint template 20 is applied to the peripheral faces of the imprint template 20, the imprint template 20 can be made to bend up or down (in relation to the orientation of the imprint template 20 shown in FIG. 2b) depending on whether the force is applied above or below the neutral plane NP. In general, the imprint template 20 can be made to bend by applying a force to a side of the imprint template, the force being applied at a position displaced from the neutral plane which substantially bisects the side. Bending of the imprint template 20 may be used to improve the imprinting of a pattern using the imprint template, and/or the release of the imprint template 20 from a medium into which the imprint template has been imprinted. The concept and advantages of template bending is known, and so will not be described in more detail here.

It will be appreciated that piezoelectric elements 22 can be located at any appropriate location along the peripheral faces of the imprint template 20. In some applications, the piezoelectric elements 22 may be located on the neutral plane NP, for example when in-plane compensation of the shape and/or size of the imprint template 20 is required. For instance, such in-plane compensation may be desired when there is a change in shape and/or size somewhere in the imprint lithography system, for which the imprint template 20 is able to compensate. Furthermore, it will be appreciated that only a single layer of piezoelectric elements 22 may be used, and that more or less than seven piezoelectric elements 22 may be used for each face of the imprint template.

Figures 3A, 3B:
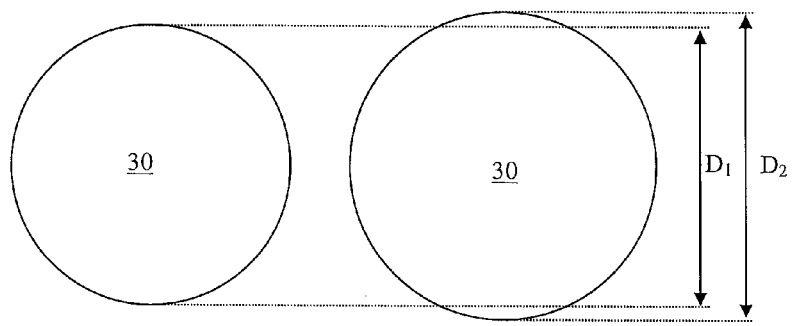
FIGS. 3a and 3b schematically depict an increase in diameter of a substrate due to a uniform increase in temperature of the substrate.

FIG. 3a depicts a plan view of a substrate 30 at a first (uniform) temperature $T_1$. The substrate 30 at a first temperature $T_1$ has a diameter $D_1$. FIG. 3b shows that at a higher (uniform) temperature $T_2$, the substrate 30 has a diameter $D_2$ which is greater than the diameter $D_1$, resulting in a change in size of the substrate 30. If the higher temperature $T_2$ were not uniform, then there may be a varying change in diameter leading to a change in shape of the substrate 30. The change in size of the substrate 30 is exaggerated in FIGS. 3a and 3b for explanatory purposes. Nevertheless, it will be understood that a change in shape and/or size of the substrate 30 of only a few nanometers may be significant in an imprint lithography process. This is because adjacent or overlaid patterns may need to be aligned with one another with nanometer accuracy. Thus, if changes in temperature and therefore expansion or contraction of the substrate 30 are not taken into account when imprinting patterns, adjacent or overlaid patterns imprinted onto the substrate 30 may not be accurately overlaid or aligned with one another. This can result in the creation of devices, or parts of devices, which do not function properly or at all.

Figures 4A, 4B:
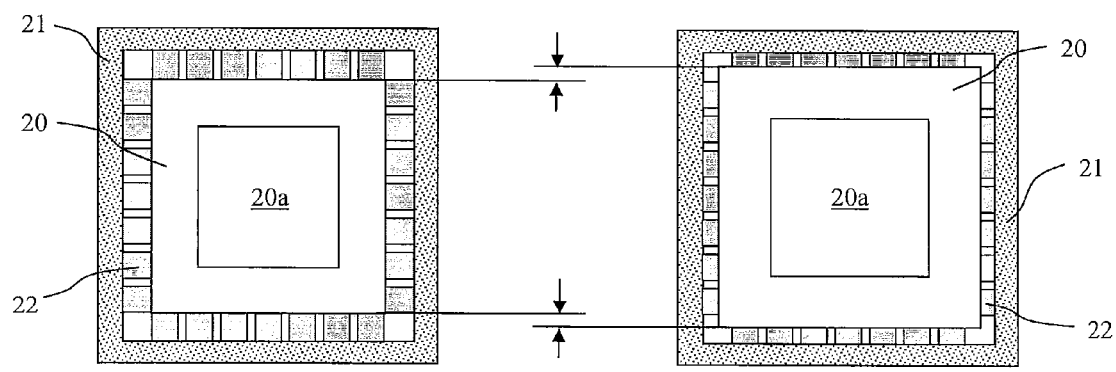
FIGS. 4a and 4b schematically depict the changing of the size of a part of the imprint template configuration described in relation to FIG. 2a, in order to take into account the change in temperature of the substrate of FIGS. 3a and 3b, in accordance with an embodiment of the present invention.

FIGS. 4a and 4b schematically depict an imprint template configuration which can be used to reduce or eliminate the problem associated with the change in diameter (or more generically, shape and/or size) of the substrate as a function of temperature, in accordance with an embodiment of the present invention.

FIG. 4a schematically depicts the same template configuration as shown in and described with reference to FIG. 2a. The same features are therefore given the same reference numerals. FIG. 4b shows the same imprint apparatus as is shown in FIG. 4a, but when the piezoelectric elements 22 have been contracted in order to expand the imprint template 20. The expansion of the imprint template 20 is not arbitrary, but is instead linked to the increase in temperature (and therefore, increase in shape and/or size) of the substrate shown in and described with reference to FIGS. 3a and 3b. For instance, the temperature of the substrate may be measured using a thermocouple or thermal imaging camera, or other suitable arrangement, and the detected temperature of the substrate (or a relevant part or part of the substrate) fed back to a controller of the piezoelectric elements 22. The controller of the piezoelectric elements 22 can then control the piezoelectric elements 22 to expand or contract as is necessary to take into account changes in temperature of the substrate and/or template. The degree of expansion or contraction of the piezoelectric elements 22 and/or imprint template 20 may be determined from modeling, experimental results or from known mathematical relationships (e.g. related to the degree of expansion or contraction for a given temperature change).

It may not be necessary to measure the temperature of the substrate or template directly. For instance, a change in the position or orientation of one or more alignment marks provided on the substrate or template may be used to determine the degree of expansion or contraction of the substrate relative to the template as a consequence of a temperature change in one or both of the substrate and template. In some embodiments, a change in the overall (or average) temperature of the substrate may be determined. For more accurate control of the alignment and/or overlay of imprinted patterns, however, the temperature and/or the thermal deformation of one or more parts of the substrate may be determined, for example those one or more parts onto which a pattern is to be imprinted.

Figures 5A, 5B:
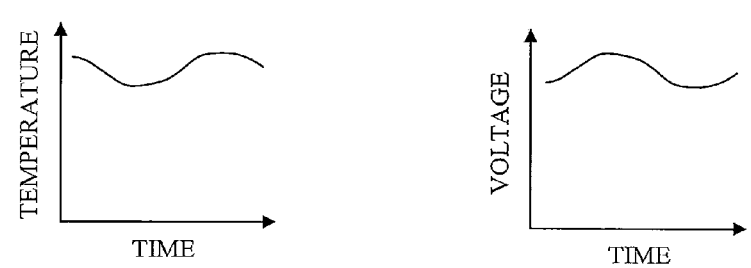
FIGS. 5a and 5b schematically depict graphs representing changes in temperature of the substrate and changes in the voltage used to control piezoelectric actuators of the imprint template configuration, respectively, in accordance with an embodiment of the present invention.

FIG. 5a shows an example of temperature variation of the substrate over a period of time. It can be seen that the temperature increases and decreases over a period of time. The shape and/or size of the substrate will also increase and decrease over this period of time. In order to take into account such a change in temperature of the substrate, and therefore a change in shape and/or size of the substrate, the degree of expansion or contraction of the piezoelectric elements will also need to be varied. This is so that the size and/or shape of the imprint template can be changed to match the degree of expansion or contraction of the substrate, thus making it possible to more accurately overlay imprinted patterns. FIG. 5b shows how such contraction and/or expansion may be controlled by varying the voltage applied across the piezoelectric elements over a period of time. It can be seen from a comparison of FIGS. 5a and 5b that as the temperature of the substrate decreases the voltage applied to the (preloaded) piezoelectric elements increases. This means that as the temperature of the substrate decreases, causing the substrate to contract, the force applied by the piezoelectric elements on the imprint template increases, causing the imprint template to be contracted (or, in other words, compressed) to take into account the contraction of the substrate. Similarly, if the temperature of the substrate increases, causing the substrate to expand, the voltage applied across the piezoelectric elements is decreased in order to reduce the compressive force applied to the imprint template and to cause the imprint template to expand to take into account the expansion of the substrate. The piezoelectric elements may be controlled to contract, thereby apply a pulling force to the substrate. The piezoelectric elements may be preloaded and controlled to change the degree of compressive force that they apply to the imprint template (as opposed to applying a pulling tensile force to the substrate).

Because the change in shape and/or size of the imprint template is linked to the change in temperature (and therefore shape and/or size) of the part of the substrate onto which a pattern is to be imprinted, patterns may be more accurately aligned or overlaid with one another.

Figures 6A, 6B:
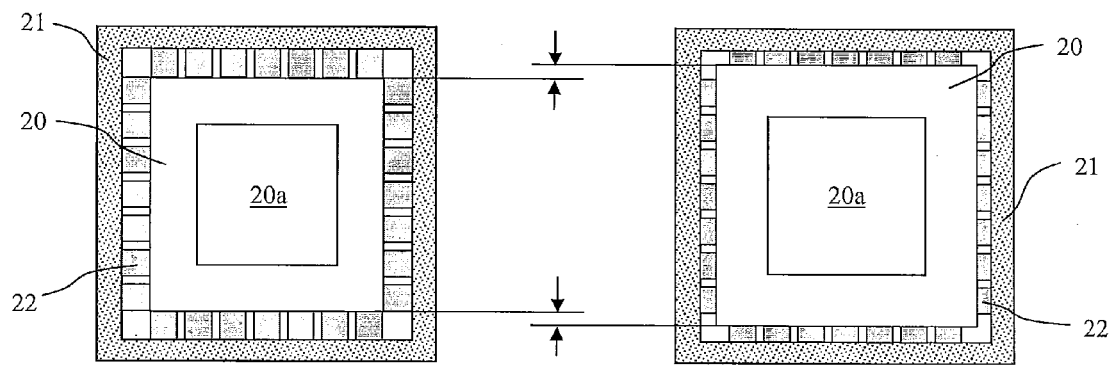
FIGS. 6a and 6b schematically depict the use of actuators to change the shape of an imprint template.

FIGS. 6a and 6b schematically depict the same imprint template configuration, and changes in that imprint template configuration, as shown in and described with reference to FIGS. 4a and 4b. The same features are therefore given the same reference numerals. In summary, it can be seen from FIG. 6b that the piezoelectric elements 22 are being controlled to cause deformation of the imprint template 20, relative to the shape of the imprint template 20 shown in FIG. 6a. In addition or alternatively to a change in size, a deformation may be a change in shape. In that case, for example, the upper and lower piezoelectric elements 22 extend and the left and right piezoelectric elements 22 contract or for example, the upper and lower piezoelectric elements 22 extend in a different proportion to the left and right piezoelectric elements 22.

Figures 7A, 7B:
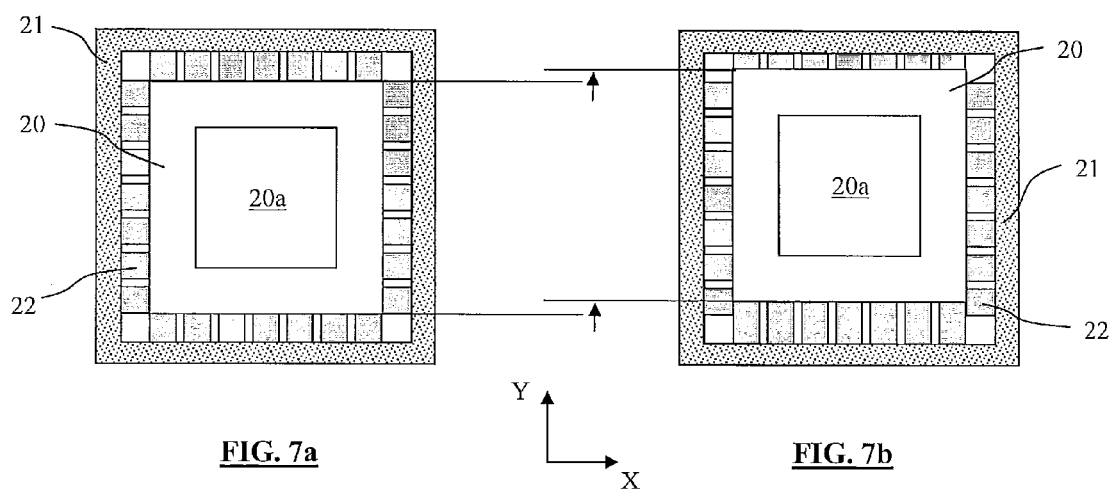
FIGS. 7a and 7b schematically depict the use of actuators to change the position of an imprint template in accordance with an embodiment of the present invention.

According to an embodiment of the present invention, the piezoelectric elements 22 may alternatively or additionally be used to control a position of the imprint template 20. FIG. 7a shows the imprint template 20 in a first position. FIG. 7b shows the imprint template 20 moved to a second position, shifted in the Y-direction (as indicated by arrows). The imprint template 20 is moved in the Y-direction by causing appropriate piezoelectric elements 22 to expand and/or contract. For example, such movement in the Y-direction may be controlled by causing piezoelectric elements 22 aligned in that Y-direction to expand and/or contract. Movement in the X-direction may be controlled by appropriate control of piezoelectric elements aligned in the X-direction. Rotation about a Z-axis (orthogonal to the X and Y axes) may be controlled by appropriate control of piezoelectric elements aligned in the X-direction and the Y-direction, by a combination of expansion and/or contraction of the piezoelectric elements. If the imprint template is to be moved in the direction of one or more piezoelectric elements, those elements may be made to contract (or expand to a lesser extent). If the imprint template is to be moved away from one or more piezoelectric elements, those elements may be made to expand (or contract to a lesser extent).

Movement of the imprint template 20 by the piezoelectric elements 22 may be used to, for example, undertake fine alignment of the position of the imprint template 20 before it is imprinted into an imprintable medium, or while the imprint template 20 is imprinted in an imprintable medium.

As well as using the piezoelectric elements to control the position of the imprint template 20 in the X and/or Y-directions and/or rotation about the Z-axis, the piezoelectric elements 22 can also be used to control the shape and/or size of the imprint template 20, as described above. Control of the shape and/or size and/or position of the imprint template may be undertaken by a controller of the piezoelectric elements (or whichever actuators are used).

In the embodiments shown in and described with reference to FIGS. 2 to 7, the actuators that are used to compress or expand the imprint template are described as being piezoelectric elements. Other actuators may be used, for example pneumatic or hydraulic pistons, electromagnetic actuators, a voice coil, a screw thread arrangement, etc., in a direct or indirect manner. In some applications at least, however, piezoelectric elements are desired, since the expansion or contraction of piezoelectric elements can be accurately controlled.

Although the expansion or contraction of piezoelectric elements can be accurately controlled, piezoelectric elements also have one or more associated disadvantages. One disadvantage associated with the use of piezoelectric elements is their short (or in other words small) range of motion. In other words, the degree to which piezoelectric elements can expand or contract is small. In most applications, the piezoelectric elements will be attached to the support structure which surrounds the imprint template. The piezoelectric elements will, in use, meet and push against a surface (e.g. a peripheral face or edge) of the imprint template to keep the imprint template in place. The piezoelectric elements may be located in recesses or abut against lips or the like of the imprint template, but will not usually be attached to the imprint template. This is so that the imprint template can be removed from the support structure and piezoelectric element arrangement and, for example, be replaced with another imprint template, for example an imprint template provided with a different pattern. While the limited degree of motion of the piezoelectric elements may be advantageous when trying to accurately control the size, shape and/or position of the imprint template, the limited degree of motion is a disadvantage when trying to quickly remove an imprint template from the support structure and piezoelectric element arrangement, and/or locate an imprint template within the support structure and piezoelectric element arrangement. This is because the limited degree of motion of the piezoelectric elements does not leave much space or clearance for loading and unloading an imprint template. Such a lack of space or clearance may also increase the risk of the imprint template striking and damaging parts of the support structure, and/or one or more piezoelectric elements.

According to an embodiment of the present invention, there is provided a further support structure which surrounds the support structure described above. The further support structure is connected to the support structure described above by way of a further set of actuators. The further set of actuators have a greater (or in other words larger) degree of motion than the piezoelectric elements which connect the support structure described above to the imprint template. When controlling the size, position and/or shape of the imprint template, the piezoelectric elements between the imprint template and the support structure may be used. When it is desired to remove the imprint template, however, the further actuators located between the further support structure and the support structure described above may be actuated in order to disengage the support structure described above and the attached piezoelectric elements from the imprint template, so that the imprint template may be removed. Because the further actuators have a greater degree of motion than the piezoelectric elements, the problem described above in relation to the limited degree of motion of the piezoelectric elements can be, for example, overcome or eliminated. The inclusion of the smaller range of motion actuators (e.g. the piezoelectric elements described above) still allow the size, shape and/or position of the imprint template to be accurately controlled. A detailed embodiment will now be described.

Figure 8A:
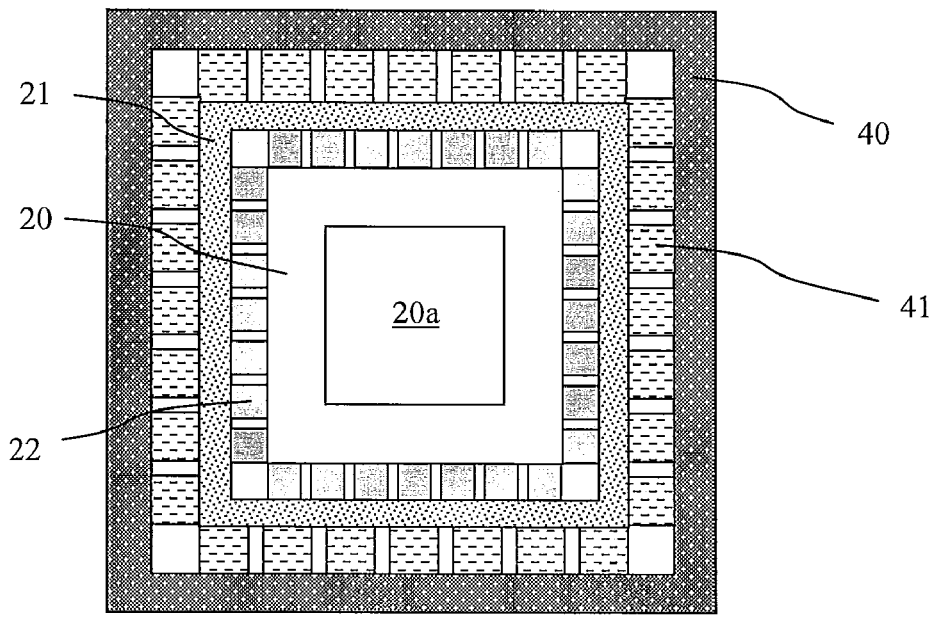
FIGS. 8a to 8c schematically depict an imprint template configuration of an imprint apparatus in accordance with a further embodiment of the present invention.
Figure 8B:
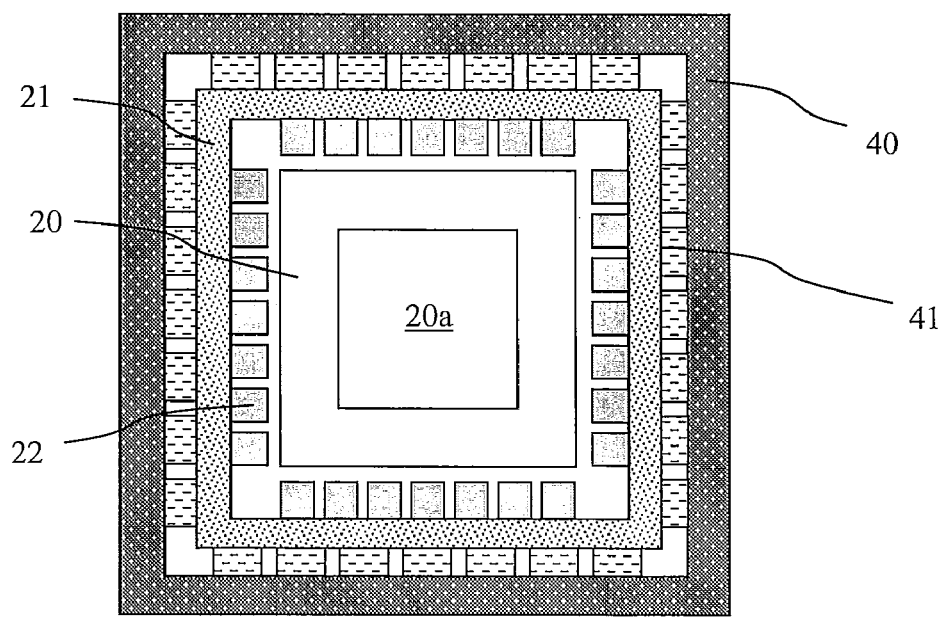
Figure 8C:
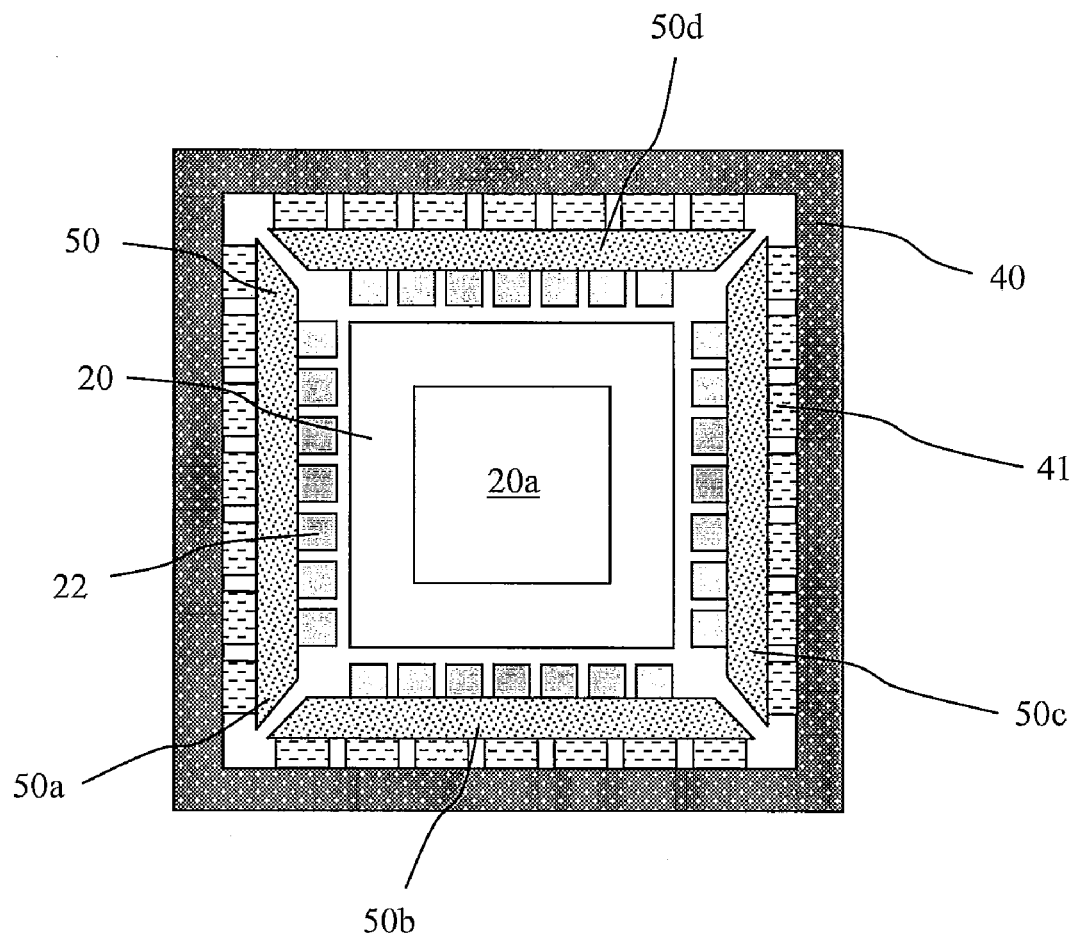

FIGS. 8a to 8c depicts an imprint template configuration according to a further embodiment of the present invention. FIG. 8a shows the imprint template 20, piezoelectric elements 22 and support structure 21 surrounding the imprint template, as described above in relation to, amongst other Figures, FIG. 2a. Further to that description, the piezoelectric elements 22 (i.e. 'first' actuators) are attached to the support structure 21 (i.e. 'first' support structure). The piezoelectric elements 22 are in temporary engagement with the imprint template 20. The engagement may be achieved by the piezoelectric elements 22 engaging with a face, edge, lip, recess, aperture, or the like provided in or on the imprint template 20.

A further support structure 40 (i.e. a 'second' support structure) surrounds the support structure 21. Located between the support structure 21 and the further support structure 40, and connecting the support structure 21 and the further support structure 40, is a plurality of further actuators 41 (i.e. 'second' actuators). The number of further actuators 41 may be small in comparison with the number of piezoelectric elements 22. The further actuators 41 may be selectively actuated to pull the support structure 21 towards the further support structure 40, or to push the support structure 21 toward the imprint template 20. The further actuators 41 have a greater range of motion than the piezoelectric elements 22. The further actuators 41 could be, for example, pneumatic actuators, hydraulic actuators, large-stroke piezoelectric elements (in comparison with short-stroke piezoelectric elements 22), electromagnetic actuators, voice coils, screw thread arrangements, or the like. The further actuators 41 may be individually controllable, so that the force they exert on the support structure can be individually controlled. Alternatively, actuators may be controlled in groups, e.g. grouped along a peripheral edge of the further support structure 40, or grouped along peripheral (e.g. opposite) edges of the further support structure 40.

FIG. 8a shows that the piezoelectric elements 22 are engaged with the imprint template 20. The piezoelectric elements 22 may therefore be used to change the shape, size and/or position (including rotation) of the imprint template 20 as described above. FIG. 8b shows that, in order to release the imprint template 20, the further actuators 41 are actuated to draw (e.g. pull) the support structure 21 towards the further support structure 40 (or, in other words, to cause the support structure 21 to expand). Because the piezoelectric elements 22 are attached to the support structure 21, such actuation of the further actuators 41 therefore causes the piezoelectric elements 22 to disengage from the imprint template 20. The imprint template 20 is therefore released, and may be removed, for example. Since the further actuators 41 have a greater range of motion than the piezoelectric elements 22, there is more space (or in other words clearance) for removal of the imprint template 20 and insertion of, for example, a replacement or alternative imprint template.

The support structure 21 shown in FIG. 8b is flexible and/or resilient enough so that it may be expanded by actuation of the further actuators 41 without being damaged or broken. Alternatively, the support structure to which the piezoelectric elements are attached may be segmented (e.g. formed from various segments or parts) such that the segments of the support structure can be separated from one another, or brought together by appropriate actuation of the further actuators, in order to disengage the piezoelectric elements from the imprint template. FIG. 8c schematically depicts such an alternative arrangement.

FIG. 8c schematically depicts an imprint template configuration of an imprint apparatus in accordance with a further embodiment of the present invention. The imprint template configuration is, in general, the same as that described in relation to FIGS. 8a and 8b. However, in contrast with the embodiments shown in and described with reference to FIGS. 8a and 8b, the embodiments shown in FIG. 8c has a segmented support structure 50 to which the piezoelectric elements 22 are attached. The segmented support structure 50 comprises of four segments 50a, 50b, 50c, and 50d.

The imprint apparatus is shown in a configuration where the further actuators 41 have been actuated to move the support structure segments 50a, 50b, 50c and 50d away from one another and towards the further support structure 40, thereby moving the piezoelectric elements 22 away from the imprint template 20. The imprint template 20 is therefore released, and is therefore free to be removed from the piezoelectric element 22 and support structure 50 arrangement.

The piezoelectric elements 22 can be brought into engagement with the imprint template 20 by appropriate actuation of the further actuators 41. The actuation is arranged to cause the support structure segments 50a, 50b, 50c and 50d to move towards one another and towards the imprint template 20, and thus brings the piezoelectric elements 22 into contact and engagement with the imprint template 20.

The arrangement shown in and described with reference to FIG. 8c may be desired over the arrangement shown in relation to FIGS. 8a and 8b. This is because in the arrangement of FIG. 8c, little or no deformation of the support structure to which the piezoelectric elements are attached is required. Deformation and in particular repeated deformation may damage the support structure and make accurate shaping or positioning of the imprint template difficult or impossible.

In an embodiment, the imprint template 20, support structure 21 and the piezoelectric elements 22 may be removable from the imprint template configuration of FIG. 8 by having the further actuators 41 disengage from the support structure 21. In this embodiment, the imprint template 20, support structure 21 and the piezoelectric elements 22 may be a unitary structure that is removable from/insertable into the apparatus, wherein the further actuators 41 allow for the easy insertion or removal of the unitary structure. In that case, the support structure 21 would not need to be deformable or otherwise changeable in shape and/or size. Power to drive the piezoelectric elements 22 may be supplied upon contact of the further actuators 41 to the support structure 21 (and similarly disengaged when the further actuators 41 no longer contact the support structure 21).

In the embodiments described above, the support structure and actuators (e.g. piezoelectric elements) have been described as being used to control the shape, size and/or position of an imprint template. Such control may be direct, for instance where the actuators are in direct contact with the imprint template, as described above. Alternatively, such control may be indirect, for instance where the actuators are in direct contact with an imprint template holder which is arranged to hold the imprint template. In such an arrangement, the shape, size and/or position of the imprint template may be controlled by appropriate control of the shape, size and/or position of the imprint template holder that is holding, or is arranged to hold, the imprint template. Also, actuators may act upon levers with or without an additional holder that is holding the template.

In the embodiments described above, the actuators have been described as being used to control the shape and/or size of an imprint template to take into account thermal deformation of the imprint template or substrate. The actuators may be used to control the position, shape and/or size of an imprint template for other reasons, for example to take into account changes in an element (e.g., a lens or a positioning system) of an imprint or optical lithography apparatus. The shape, size and/or position of an imprint template may also be controlled using the arrangement shown in and described with reference to FIG. 8 by appropriate control of the first actuators.

In the above embodiments, the second actuators have been described as being located between the first support structure and the second support structure, and being capable of applying a force to the first support structure. In another embodiment, a first actuator and a second actuator may be connected or attached to one another in a series arrangement. The combined first and second actuator may extend from the first support structure and into contact with the imprint template or imprint template holder. A second support structure (which is described above as surrounding the first support structure) may then not be required. The actuator with the greater range of movement may be used to effect large changes in position or applied forces, and the actuator with the lesser range of motion may be used to fine tune the applied force or change in position. This is advantageous, since in isolation the larger range of motion actuator may not be able to apply or maintain small changes in position or applied force, and the lesser range of motion actuator may not be able to apply desired large changes in position or applied force.

Figure 9:
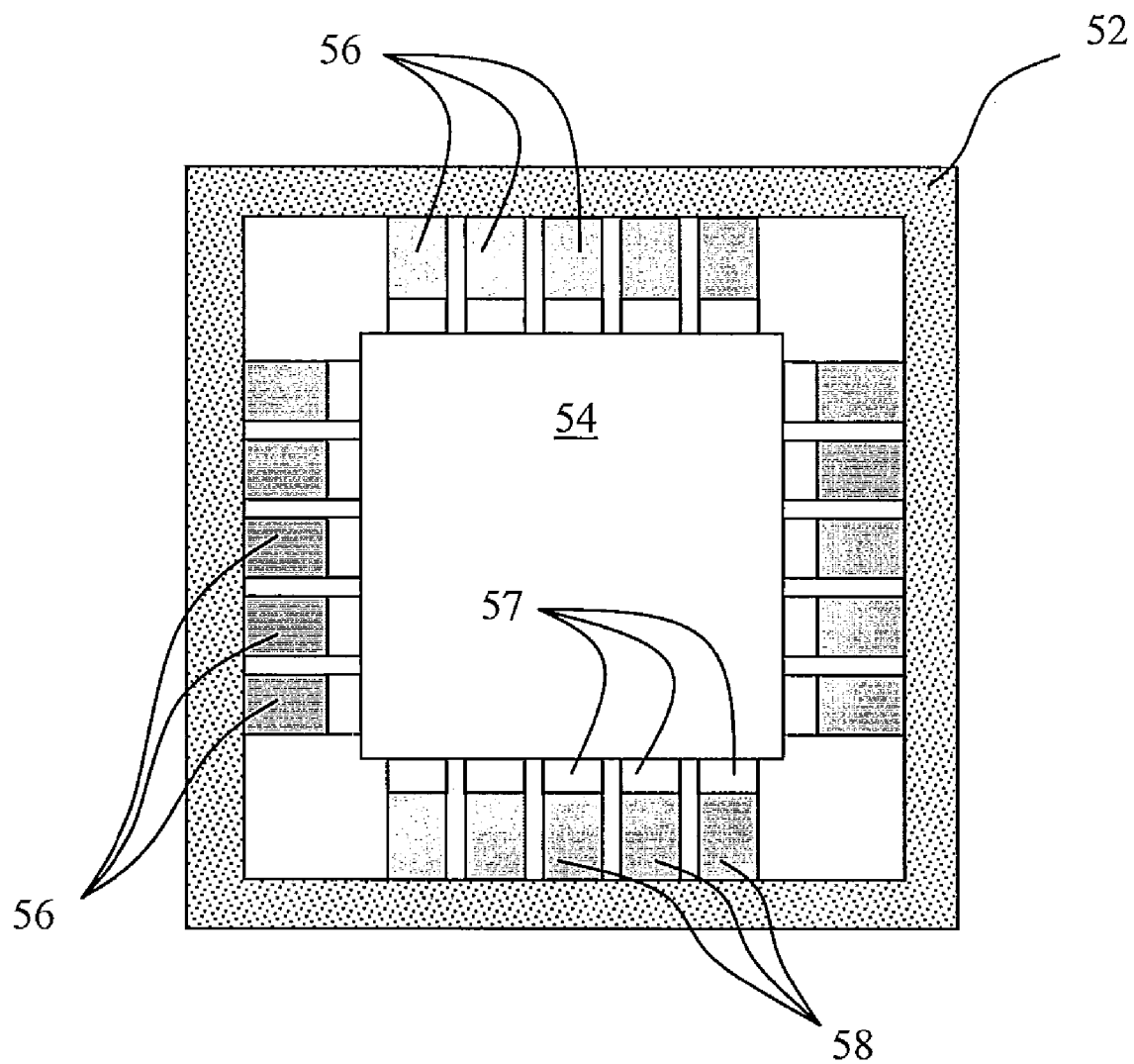
FIG. 9 schematically depicts an example of an implementation of a series arrangement of first and second actuators in accordance with an embodiment of the present invention.

FIG. 9 schematically depicts an embodiment of an implementation of a first and second actuator series arrangement. A support structure 52 is shown surrounding an imprint template 54. A plurality of first and second actuator series arrangements 56 are located around the imprint template 54, and extend from the support structure 52 and into contact with the imprint template 54.

Each first and second actuator series arrangement comprises a first actuator 57 and a second actuator 58 located in series. A range of movement of the second actuator 58 may be greater than a range of movement of the first actuator 57. The first actuator 57 may be connected to the second actuator 58 using, for example, an adhesive or a mechanical fixing such as one or more screws or bolts. The first actuator may be a piezoelectric actuator, a pneumatic actuator, a hydraulic actuator, an electromagnetic actuator, a voice coil or a screw thread arrangement. The second actuator may be a pneumatic actuator, a hydraulic actuator, an electromagnetic actuator, a voice coil or a screw thread arrangement.

Each first and second actuator series arrangement 56 may be capable of applying a force to the imprint template 54. Force may be applied using one or both of the first actuator 57 and second actuator 58. The second actuator 58, having a range of movement that may be greater than a range of movement of the first actuator 57, may be used for coarse positioning, clamping, and/or deformation of the imprint template 54. Alternatively or additionally, the first actuator 57 may be used for finer positioning, clamping, and/or deformation of the imprint template 54. In combination, the first actuator 57 and second actuator 58 may thus provide accurate and wide-ranging control of the positioning, clamping (e.g. holding) and/or deforming of the imprint template 54. In FIG. 9, the first actuator 57 is shown as being located adjacent to the imprint template arrangement, and the second actuator 58 is shown as being adjacent to the support structure. In another example, the second actuator 58 may be located adjacent to the imprint template arrangement, and the first actuator 57 may be located adjacent to the support structure.

In an embodiment, the second actuators, having a greater range of movement than the first actuators, have been described as possibly being screw thread arrangements (e.g. anything with a screw thread, such as a screw, a bolt, a screw spindle, or the like). A screw thread arrangement may be advantageous because, when in position, no energy input may be required to keep the screw thread in position, and this has the added benefit that no heat will be generated (which could cause unwanted deformation of the imprint template arrangement). It may be possible that high forces are applied to the imprint template using the screw thread arrangement. However, it may be difficult to achieve highly accurate control of the forces applied by the screw thread. The first actuators, having a range of movement smaller than the range of movement of the screw thread arrangement, may be, for example, piezoelectric actuators. The piezoelectric actuators can be used to fine tune the force applied by the screw thread arrangement, or to undertake small changes to the size, shape and/or position of the imprint template, which would be difficult or impossible to undertake with the screw thread arrangement in isolation.

Figure 10A:
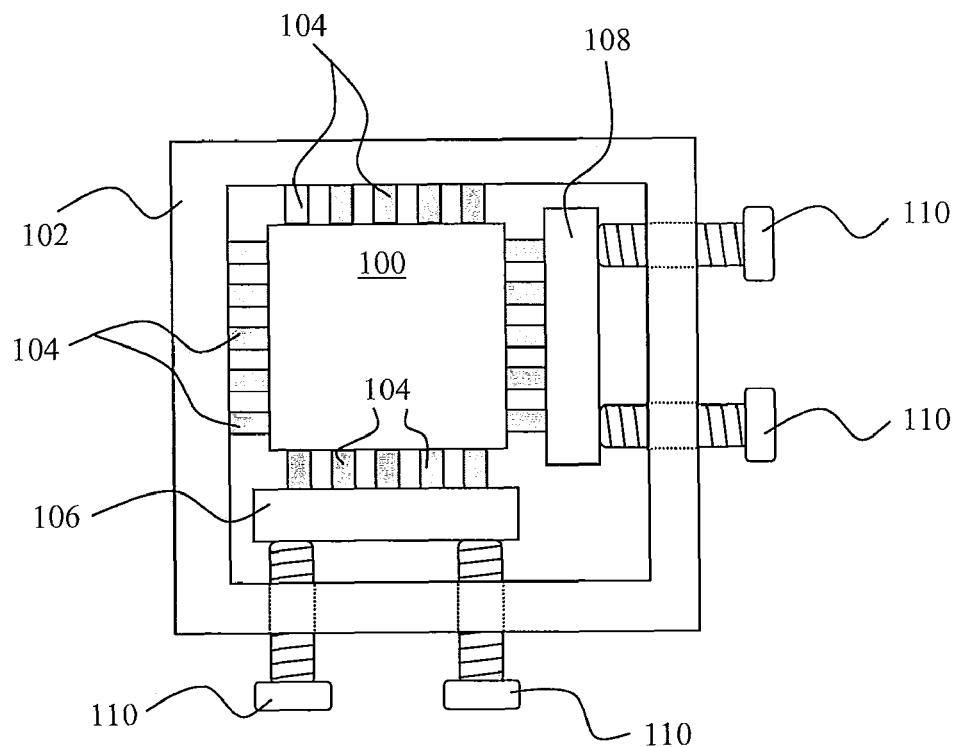
FIGS. 10a and 10b schematically depict an example of an implementation of a screw thread arrangement in relation to the clamping, deforming or moving of an imprint template arrangement.
Figure 10B:
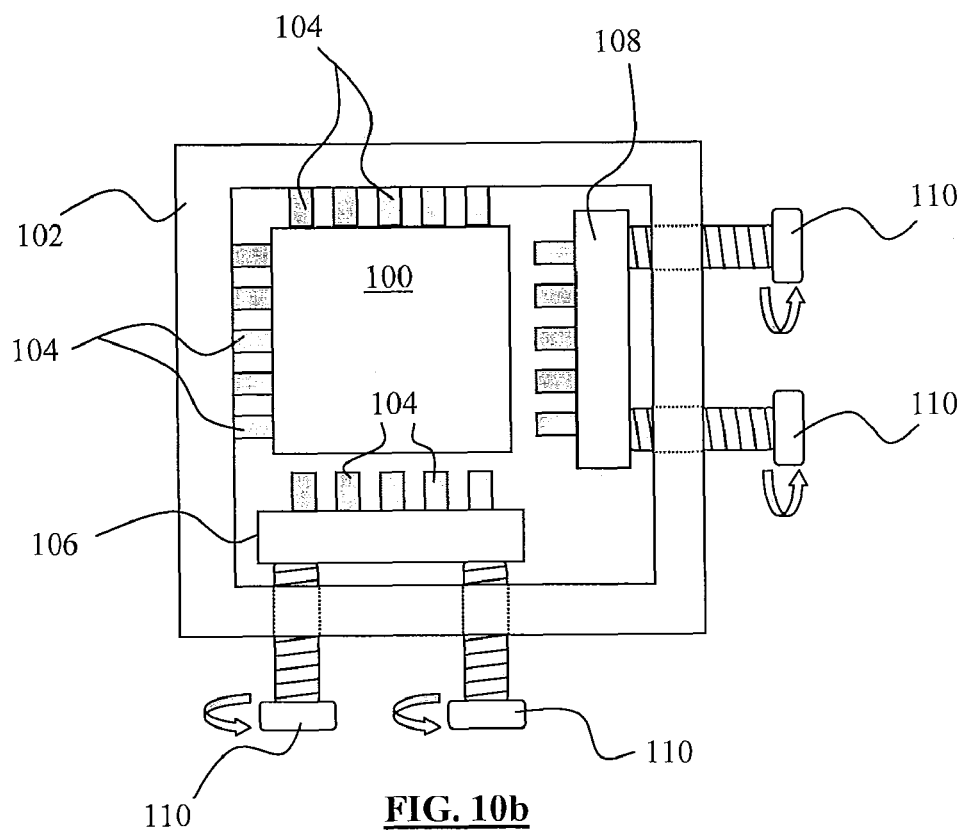

FIGS. 10a and 10b schematically depict an embodiment in which a screw thread arrangement is used. FIG. 10a schematically depicts an imprint template arrangement 100. Surrounding that imprint template arrangement is a support structure 102. A plurality of first actuators 104 (e.g. piezoelectric elements) are disposed along two sides of the support structure 102, and extend towards the imprint template arrangement 100. A further plurality of first actuators 104 are disposed along two individual segments of a further support structure, a first segment 106 and a second segment 108, and the further plurality of first actuators 104 extend toward the imprint template arrangement 100. The segments 106, 108 of the further support structure are also surrounded by the support structure 102.

The segments 106, 108 of the further support structure are attached to second actuators 110, which in this embodiment take the form of screw thread arrangements. The second actuators extend away from the segments 106, 108 of the further support structure and toward and through the support structure 102. The segments 106, 108 of the further support structure, along which are disposed first actuators 104, may be moved toward and away from the imprint template arrangement 100 by appropriate actuation (e.g. rotation) of the second actuators 110. This allows the first actuators 104 disposed on the segments 106, 108 of the further support structure to be brought into and out of contact with the imprint template arrangement 100.

FIG. 10a shows a situation wherein the segments 106, 108 of the further support structure, along which are disposed first actuators 104, have been moved toward the imprint template arrangement 100 by appropriate actuation (e.g. rotation) of the second actuators 110. FIG. 10b shows a situation wherein the segments 106, 108 of the further support structure, along which are disposed first actuators 104, have been moved away from the imprint template arrangement 100 by appropriate actuation (e.g. rotation) of the second actuators 110. Actuation (e.g. rotation) of the second actuators may be achieved in any convenient manner, for example by rotation of an arrangement with which the second actuator 110 is engaged (e.g. a bore having a screw thread), or by direct rotation of the second actuator 110 by use of a driving arrangement that can grip or otherwise co-operate with the second actuator 110.

Since the second actuators 110 have a greater range of motion than the first actuators 104, the second actuators may be used, for example, to move the segments 106, 108 of the further support structure, along which are disposed first actuators 104, to allow relatively easy loading and unloading of the imprint template arrangement 100. When all of the first actuators 104 have been brought into contact with the imprint template arrangement 100, the first actuators 104 may be used to move, clamp, and/or deform the imprint template arrangement 100. Actuation of the second actuators 110 may alternatively or additionally be used to apply a force to the imprint template arrangement, and this force can be used to move, clamp, and/or deform the imprint template arrangement 100.

In an embodiment, the imprint template may be moved or deformed directly (e.g. by moving and/or deforming the imprint template) or indirectly (e.g. by moving and/or deforming an imprint template holder). Generally speaking, an imprint template may be moved and/or deformed by moving and/or deforming an imprint template arrangement, the imprint template arrangement being an imprint template, an imprint template holder, or an imprint template holder that is holding an imprint template.

Figure 11:
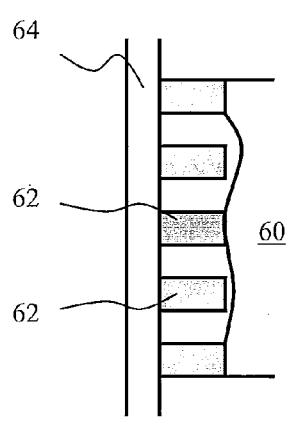
FIG. 11 schematically depicts a problem that may be encountered when clamping, positioning or deforming an imprint template.

FIG. 11 depicts a problem associated with the movement, deformation and/or clamping of an imprint template 60. Only a part of the imprint template 60 is shown in FIG. 11. Actuators 62 used to position, deform and/or hold (e.g. clamp) the imprint template 60 extend from a support structure 64 and toward and into contact with the imprint template 60. Due to imperfections in the manufacture of the imprint template 60, a side of the imprint template 60 is not flat, but instead comprises undulations. These undulations result, in this instance, in not all actuators 62 being in contact with the imprint template 60. This means that some of the actuators cannot be used to, for example, move, hold, and/or deform the imprint template 60.

In order to overcome a problem illustrated in FIG. 11 or any other problem, it may be possible to activate the actuators 62 to extend or move the actuators 62 towards the imprint template 60, and bring the actuators 62 into contact with the imprint template 60. However, such activation to achieve such movement or extension may take up a valuable part of the range of movement of the actuator 62. This may mean that there is little or no further extension or movement possible to hold, deform and/or move the imprint template 60.

Figure 12:
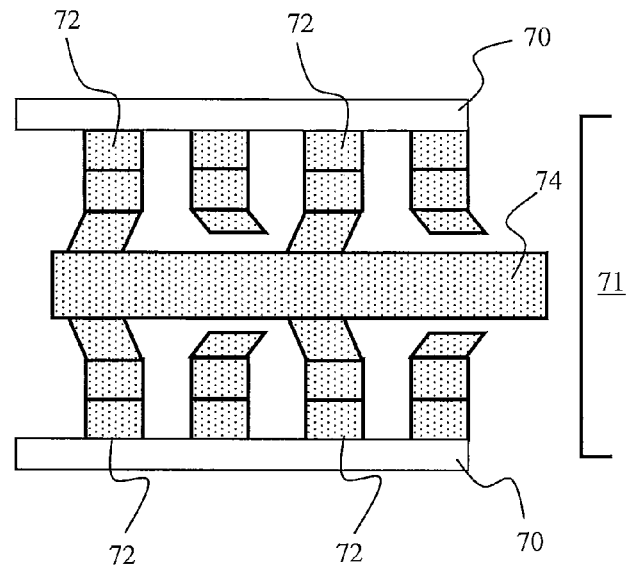
FIGS. 12 and 13 schematically depict arrangements for obviating or mitigating, for example, a problem shown in and described with reference to FIG. 11.
Figure 13:
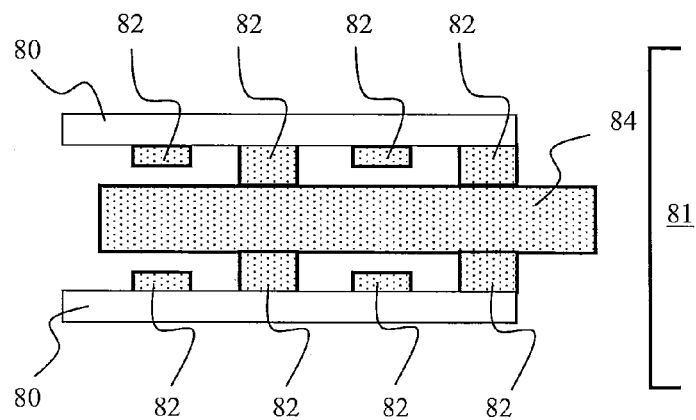

According to an embodiment, an imprint lithography apparatus is provided which comprises: a support structure arranged to support an imprint template arrangement; a first actuator attached to the support structure, and arranged in use to support a second actuator, the second actuator configured to apply a force to the imprint template arrangement, wherein the first actuator is actuable to move the second actuator. This means that the first actuator can be used to move the second actuator toward and into contact with the imprint template arrangement, such that the second actuator can be used to move, hold, and/or deform the imprint template arrangement. Furthermore, if the second actuator is already in contact with the imprint template arrangement, the first actuator can be used to, for example, move the imprint template arrangement by moving the second actuator. Movement of the second actuator may be achieved without any activation of the second actuator, meaning that no range of motion of each second actuator is lost during and after movement of the second actuator. The full range of motion of the second actuator is therefore available for holding, moving and/or deforming the imprint template arrangement. FIGS. 12 and 13 schematically depict embodiments demonstrating these principles.

FIG. 12 schematically depicts a side on view of an arrangement to position an actuator. The arrangement comprises a support structure 70 which may fully or partially surround an imprint template arrangement 71. Extending from different sides of that support structure 70 is a plurality of first actuators 72. The first actuators 72 support a second actuator 74. The second actuator 74 extends through the support structure 70. The first actuators 72 may be used to selectively clamp and move the second actuator 74 in a continuous or step-wise manner. The first actuators 72 may be used to, for example, position the second actuator 74 adjacent to or in contact with an imprint template arrangement 71.

The first actuators 72 may be piezoelectric elements, which can be controlled with a high degree of accuracy. Other actuators may be used. The second actuator 74 may be a piezoelectric element, which can be controlled with a high degree of accuracy. Other actuators may be used. Clamping and movement of the second actuator 74 may be achieved by the application of appropriate electric fields across one or more components of the first actuators 72 to control the orientation or extent of one or more parts of the first actuators 72 in one or more dimensions.

In another example (not shown), the first actuators may not clamp the second actuator. Instead, the second actuator may sit on first actuators located below the second actuator (e.g. the lower plurality of first actuators in FIG. 12). The first actuators may be selectively activated to move the second actuator.

FIG. 13 schematically depicts a further arrangement to position an actuator. Shown in side-on view, the arrangement comprises a support structure 80 which may fully or partially surround an imprint template arrangement 81. Extending from different sides of that support structure 80 is a plurality of first actuators 82. The first actuators 82 support a second actuator 84. The second actuator 84 extends through the support structure 80. The first actuators 82 are selectively controlled to clamp or release a portion of second actuator 84. A portion of the second actuator 84 may be clamped by one or more of the first actuators 82. The second actuator 84 may be controlled to expand. Further first actuators 82 may then clamp a different portion of the second actuator 84, and previously clamping first actuators 82 can then be unclamped allowing a portion of the second actuator 84 to move between the first actuators 82. This process can be repeated to move the second actuator 84 in a step-wise manner in-between the first actuators 82 and, for example, position the second actuator 84 adjacent to or in contact with the imprint template arrangement 81.

The first actuators 82 may be piezoelectric elements, which can be controlled with a high degree of accuracy. Other actuators may be used. The second actuator 84 may be a piezoelectric element, which can be controlled with a high degree of accuracy. Other actuators may be used. Clamping and movement of the second actuator 84 may be achieved by the application of appropriate electric fields across one or more components of the first actuators 82 to control the orientation or extent of one or more parts of the first actuators 82 in one or more dimensions.

The arrangement shown in FIGS. 12 and 13 may be used to position one or more actuators relative to an imprint template arrangement. Even though the movement of only a single actuator is depicted, more than one actuator can be moved. If the actuators are in contact with and/or attached to the imprint template arrangement, the arrangements shown in FIGS. 12 and 13 can alternatively or additionally be used to position the imprint template arrangement.

The first actuators shown in FIGS. 12 and 13 may move only a second actuator, or a body of material or the like to which the second actuator is attached, or of which the second actuator forms a part. The first actuators shown in FIGS. 12 and 13 may support and be actuable to move a plurality of actuators, for example a second actuator attached to one or more further actuators (which may be of the first actuator or second actuator type). The further actuators may be used to assist in the movement of the second actuator, for example by appropriate expansion or compression of one or more of the further actuators. A plurality of first actuators may be provided, the plurality of first actuators extending from one or more sides or parts (or different sides or parts) of the support structure to support the second actuator. The support structure may fully or partially surround the imprint template arrangement. A plurality of first actuators may be attached to the support structure, and be located such that the plurality of first actuators extend along one or more sides of the imprint template arrangement. The first actuator may be one of: a piezoelectric actuator, a pneumatic actuator, a hydraulic actuator, an electromagnetic actuator, a voice coil or a screw thread arrangement, and/or the second actuator is one of: a pneumatic actuator, a hydraulic actuator, an electromagnetic actuator, a voice coil or a screw thread arrangement.

In some embodiments described above, one or more second actuators have been described as having a greater range of motion than one or more first actuators. With a single imprint template arrangement, movement of the substrate onto which a pattern is to be imprinted may mean that the use of such second actuators is not required. The use of such second actuators (possibly in conjunction with described first actuators) may be more useful in arrangements where a plurality of imprint templates are used in parallel, since the imprint templates may need to be moved relative to one another, and movement of the substrate cannot achieve this control.

In the above embodiments, the actuators (e.g. first and/or second actuators) have been described as, for example, extending between a support structure and an imprint template arrangement, or extending between different (e.g. first and second) support structures. As well as extending between such structures, the actuators may extend through the structure, for example through a support structure.

The above mentioned embodiments have been given by way of example only, and are intended to be illustrative and are not intended to be limiting. It will be appreciated to one of ordinary skill in the art that modifications may be made to the described embodiments, as well as embodiments not described herein, without departing from the scope of the invention as set out by the claims that follow.

The invention claimed is:

1. An imprint lithography apparatus comprising:
 a first support structure arranged to support an imprint template arrangement;
 a first actuator attached to the first support structure, and arranged in use to be located between the first support structure and the imprint template arrangement, the first actuator configured to apply a force to the imprint template arrangement;
 a second support structure; and
 a second actuator located between the second support structure and the first support structure, the second actuator configured to apply a force to the first support structure, a range of movement of the second actuator being greater than a range of movement of the first actuator.

2. The apparatus of claim 1, wherein the first actuator is configured to apply a force to a peripheral edge or face of the imprint template arrangement.

3. The apparatus of claim 1, wherein the second actuator is configured to apply a force to a peripheral edge or face of the first support structure.

4. The apparatus of claim 1, wherein:
 another first actuator is provided on an opposite side of the first support structure to meet an opposite side of the imprint template arrangement; and/or
 another second actuator is provided on an opposite side of the second support structure to meet an opposite side of the first support structure.

5. The apparatus of claim 1, wherein:
 the first actuator is one of a plurality of first actuators, and/or
 the second actuator is one of a plurality of second actuators.

6. The apparatus of claim 5, wherein:
 the first actuators are individually controllable; and/or
 the second actuators are individually controllable.

7. The apparatus of claim 5, wherein:
the plurality of first actuators are located in positions on the first support structure which, in use, surround the imprint template arrangement, or extend along one or more sides of the imprint template arrangement; and/or
the plurality of second actuators are located in positions on the second support structure which surround the first support structure or extend along one or more sides of the first support structure.

8. The apparatus of claim 1, wherein the first actuator is a piezoelectric actuator, a pneumatic actuator, a hydraulic actuator, an electromagnetic actuator, a voice coil or a screw thread arrangement.

9. The apparatus of claim 1, wherein the second actuator is a pneumatic actuator, a hydraulic actuator, an electromagnetic actuator, a voice coil or a screw thread arrangement.

10. The apparatus of claim 1, wherein the first support structure is arranged to surround the imprint template arrangement.

11. The apparatus of claim 1, wherein the second support structure is arranged to surround the first support structure.

12. The apparatus of claim 1, wherein the first support structure is expandable, or comprises a plurality of segments.

13. The apparatus of claim 1, wherein the second actuator is attached to the second support structure and the first support structure.

14. An imprint lithography apparatus comprising:
a support structure arranged to support an imprint template arrangement; and
a first actuator and a second actuator arranged in series with respect to one another to form a first and second actuator series arrangement, the first and second actuator series arrangement being attached to the support structure, and arranged in use to be located between the support structure and the imprint template arrangement, the first and second actuator series arrangement configured to apply a force to the imprint template arrangement, and a range of movement of the second actuator is greater than a range of movement of the first actuator.

15. The apparatus of claim 1, wherein the first actuator is actuable to apply the force on the imprint template without actuating the second actuator.

16. The apparatus of claim 1, wherein the first support structure is arranged to support the imprint template arrangement using the first actuator.

17. The apparatus of claim 1, wherein the second actuator is adapted to exert a pulling force on the first support structure to disengage the first actuator from the imprint template arrangement.

18. The apparatus of claim 1, wherein the first and the second actuators are individually controllable.

* * * * *